United States Patent
Farber et al.

(10) Patent No.: US 7,913,703 B1
(45) Date of Patent: Mar. 29, 2011

(54) METHOD AND APPARATUS FOR UNIFORMLY APPLYING A MULTI-PHASE CLEANING SOLUTION TO A SUBSTRATE

(75) Inventors: Jeffrey J. Farber, Delmar, NY (US); Ji Zhu, El Cerrito, CA (US); Carl Woods, Aptos, CA (US); John M. de Larios, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 417 days.

(21) Appl. No.: 11/395,851

(22) Filed: Mar. 30, 2006

Related U.S. Application Data

(63) Continuation-in-part of application No. 10/608,871, filed on Jun. 27, 2003, now abandoned.

(60) Provisional application No. 60/755,377, filed on Dec. 30, 2005.

(51) Int. Cl.
*B08B 3/00* (2006.01)

(52) U.S. Cl. ... 134/184; 134/157; 134/902; 156/345.51; 156/345.55

(58) Field of Classification Search .................. None
See application file for complete search history.

(56) References Cited

U.S. PATENT DOCUMENTS

| | | | |
|---|---|---|---|
| 3,037,887 A | 6/1962 | Brenner et al. | 134/22 |
| 3,212,762 A | 10/1965 | Carroll et al. | 261/124 |
| 3,436,262 A | 4/1969 | Crowe et al. | 134/10 |
| 3,617,095 A | 11/1971 | Lissant | |
| 3,978,176 A | 8/1976 | Voegeli | 261/122 |
| 4,085,059 A | 4/1978 | Smith et al. | 252/118 |
| 4,133,773 A | 1/1979 | Simmons | 252/359 |
| 4,156,619 A | 5/1979 | Griesshammer | 134/2 |
| 4,238,244 A | 12/1980 | Banks | 134/22 |
| 4,658,842 A * | 4/1987 | Jensen | 134/183 |
| 4,781,764 A | 11/1988 | Leenaars | 134/34 |
| 4,817,652 A | 4/1989 | Liu et al. | 134/102 |
| 4,838,289 A | 6/1989 | Kottman et al. | |
| 4,849,027 A | 7/1989 | Simmons | 134/22 |
| 4,911,761 A | 3/1990 | McConnell et al. | 134/11 |

(Continued)

FOREIGN PATENT DOCUMENTS

DE 40-38-587 6/1992

(Continued)

OTHER PUBLICATIONS

Kittle, et al. "Removing Particles with a Foam Medium" Internet http://www.aquafoam.com/paper/A2C2foamedium.pdf.

(Continued)

*Primary Examiner* — Michael Komakov
*Assistant Examiner* — Eric Golightly
(74) *Attorney, Agent, or Firm* — Martine Penilla & Gencarella, LLP

(57) ABSTRACT

An apparatus used to supply a force onto a cleaning solution for processing a substrate for cleaning surface contaminants is disclosed. The apparatus includes a force applicator and a gate. The force applicator is configured to be adjusted to a first height off the surface of the substrate. The gate is positioned adjacent to a trailing point of the force applicator and is configured to be adjusted to a second height off of the surface of the substrate to enable planarization of the cleaning solution as the solution moves to the trailing point.

14 Claims, 10 Drawing Sheets

U.S. PATENT DOCUMENTS

| | | | |
|---|---|---|---|
| 4,962,776 A | 10/1990 | Liu et al. | 134/11 |
| 5,000,795 A | 3/1991 | Chung et al. | 134/37 |
| 5,048,549 A | 9/1991 | Hethcoat | |
| 5,102,777 A | 4/1992 | Lin et al. | 430/331 |
| 5,105,556 A | 4/1992 | Kurokawa et al. | 34/12 |
| 5,113,597 A | 5/1992 | Sylla | 34/22 |
| 5,175,124 A | 12/1992 | Winebarger | 437/180 |
| 5,181,985 A | 1/1993 | Lampert et al. | 156/635 |
| 5,226,969 A | 7/1993 | Watanabe et al. | |
| 5,242,669 A | 9/1993 | Flor | |
| 5,271,774 A | 12/1993 | Leenaars et al. | |
| 5,288,332 A | 2/1994 | Pustilnik et al. | 134/27 |
| 5,306,350 A | 4/1994 | Hoy et al. | 134/22.14 |
| 5,336,371 A | 8/1994 | Chung et al. | 156/659.1 |
| 5,415,191 A | 5/1995 | Mashimo et al. | 134/102.1 |
| 5,417,768 A | 5/1995 | Smith et al. | 134/10 |
| 5,464,480 A | 11/1995 | Matthews | 134/1.3 |
| 5,472,502 A | 12/1995 | Batchelder | 118/52 |
| 5,494,526 A | 2/1996 | Paranjpe | 134/1 |
| 5,498,293 A | 3/1996 | Ilardi et al. | 134/3 |
| 5,656,097 A | 8/1997 | Olesen et al. | 134/1 |
| 5,660,642 A | 8/1997 | Britten | |
| 5,705,223 A | 1/1998 | Bunkofske | |
| 5,800,626 A | 9/1998 | Cohen et al. | |
| 5,858,283 A | 1/1999 | Burris | 261/122.1 |
| 5,900,191 A | 5/1999 | Gray et al. | 261/59 |
| 5,904,156 A | 5/1999 | Advocate, Jr. et al. | 134/2 |
| 5,908,509 A | 6/1999 | Olesen et al. | 134/1.3 |
| 5,911,837 A | 6/1999 | Matthews | 134/2 |
| 5,932,493 A | 8/1999 | Akatsu et al. | 438/745 |
| 5,944,581 A | 8/1999 | Goenka | |
| 5,944,582 A | 8/1999 | Talieh | |
| 5,945,351 A | 8/1999 | Mathuni | |
| 5,951,779 A | 9/1999 | Koyanagi et al. | 134/2 |
| 5,964,954 A | 10/1999 | Matsukawa et al. | |
| 5,964,958 A | 10/1999 | Ferrell | 134/26 |
| 5,968,285 A | 10/1999 | Ferrell et al. | 134/26 |
| 5,997,653 A | 12/1999 | Yamasaka | |
| 6,048,409 A | 4/2000 | Kanno et al. | 134/34 |
| 6,049,996 A | 4/2000 | Freeman et al. | |
| 6,081,650 A | 6/2000 | Lyons et al. | |
| 6,090,217 A | 7/2000 | Kittle | 134/11 |
| 6,092,538 A | 7/2000 | Arai et al. | 134/1.3 |
| 6,152,805 A | 11/2000 | Takahashi | |
| 6,158,445 A | 12/2000 | Olesen et al. | 134/1.3 |
| 6,167,583 B1 | 1/2001 | Miyashita et al. | |
| 6,197,113 B1* | 3/2001 | Zimmer | 118/249 |
| 6,228,563 B1 | 5/2001 | Starove et al. | |
| 6,267,125 B1 | 7/2001 | Bergman et al. | 134/102.1 |
| 6,270,584 B1 | 8/2001 | Ferrell et al. | 134/26 |
| 6,272,712 B1 | 8/2001 | Gockel et al. | |
| 6,276,459 B1 | 8/2001 | Herrick et al. | 169/14 |
| 6,286,231 B1 | 9/2001 | Bergman et al. | 34/410 |
| 6,290,780 B1 | 9/2001 | Ravkin | |
| 6,296,715 B1 | 10/2001 | Kittle | 134/2 |
| 6,319,801 B1 | 11/2001 | Wake et al. | 438/585 |
| 6,352,082 B1 | 3/2002 | Mohindra et al. | 134/25.4 |
| 6,386,956 B1 | 5/2002 | Sato et al. | |
| 6,398,975 B1 | 6/2002 | Mertens et al. | |
| 6,401,734 B1 | 6/2002 | Morita et al. | |
| 6,423,148 B1 | 7/2002 | Aoki | 134/3 |
| 6,439,247 B1 | 8/2002 | Kittle | 134/102.1 |
| 6,457,199 B1 | 10/2002 | Frost et al. | |
| 6,491,043 B2 | 12/2002 | Mohindra et al. | 134/25.4 |
| 6,491,764 B2 | 12/2002 | Mertens et al. | |
| 6,493,902 B2 | 12/2002 | Lin | |
| 6,513,538 B2 | 2/2003 | Chung et al. | 134/1.2 |
| 6,514,921 B1 | 2/2003 | Kakizawa et al. | 510/175 |
| 6,527,870 B2 | 3/2003 | Gotkis | |
| 6,527,915 B2 | 3/2003 | Gu | |
| 6,532,976 B1 | 3/2003 | Huh et al. | 134/111 |
| 6,537,915 B2 | 3/2003 | Moore et al. | 438/692 |
| 6,562,726 B1 | 5/2003 | Torek et al. | 438/745 |
| 6,576,066 B1 | 6/2003 | Namatsu | 134/30 |
| 6,594,847 B1 | 7/2003 | Krusell et al. | |
| 6,616,772 B2 | 9/2003 | de Larios et al. | |
| 6,733,596 B1 | 5/2004 | Mikhaylichenko et al. | 134/60 |
| 6,787,473 B2 | 9/2004 | Andreas | 438/692 |
| 6,797,071 B2 | 9/2004 | Kittle | 134/11 |
| 6,846,380 B2 | 1/2005 | Dickinson et al. | |
| 6,851,435 B2 | 2/2005 | Mertens et al. | |
| 6,874,516 B2 | 4/2005 | Matsuno et al. | |
| 6,896,826 B2 | 5/2005 | Wojtczak et al. | 252/79.1 |
| 6,927,176 B2 | 8/2005 | Verhaverbeke et al. | 438/745 |
| 6,946,396 B2 | 9/2005 | Miyazawa et al. | 438/689 |
| 6,951,042 B1 | 10/2005 | Mikhaylichenko et al. | 15/77 |
| 7,122,126 B1 | 10/2006 | Fuentes | |
| 7,517,549 B2* | 4/2009 | Hayashi | 427/66 |
| 2001/0018320 A1* | 8/2001 | Case et al. | 451/121 |
| 2002/0072482 A1 | 6/2002 | Sachdev et al. | 510/175 |
| 2002/0094684 A1 | 7/2002 | Hirasaki et al. | |
| 2002/0121290 A1 | 9/2002 | Tang et al. | |
| 2002/0185164 A1 | 12/2002 | Tetsuka et al. | |
| 2002/0195121 A1 | 12/2002 | Kittle | |
| 2003/0075204 A1 | 4/2003 | de Larios et al. | |
| 2003/0148903 A1 | 8/2003 | Bargaje et al. | |
| 2003/0171239 A1 | 9/2003 | Patel et al. | |
| 2003/0226577 A1 | 12/2003 | Orll et al. | |
| 2004/0002430 A1 | 1/2004 | Verhaverbeke | 510/175 |
| 2004/0053808 A1 | 3/2004 | Raehse et al. | |
| 2004/0134515 A1 | 7/2004 | Castrucci | 134/2 |
| 2004/0159335 A1 | 8/2004 | Montierth et al. | |
| 2004/0163681 A1 | 8/2004 | Verhaverbeke | 134/28 |
| 2004/0261823 A1 | 12/2004 | de Larios | |
| 2005/0045209 A1 | 3/2005 | Tan | |
| 2005/0132515 A1 | 6/2005 | Boyd et al. | |
| 2005/0133060 A1 | 6/2005 | de Larios et al. | |
| 2005/0133061 A1 | 6/2005 | de Larios et al. | |
| 2005/0159322 A1 | 7/2005 | Min et al. | 510/175 |
| 2005/0176610 A1 | 8/2005 | Konno et al. | |
| 2005/0183740 A1 | 8/2005 | Fulton et al. | 134/3 |
| 2006/0201267 A1 | 9/2006 | Liu | |
| 2006/0283486 A1 | 12/2006 | de Larios et al. | |
| 2006/0285930 A1 | 12/2006 | de Larios et al. | 406/197 |
| 2006/2084930 | 12/2006 | Korolik et al. | |
| 2007/0000518 A1 | 1/2007 | de Larios et al. | |

FOREIGN PATENT DOCUMENTS

| | | |
|---|---|---|
| EP | 0827188 | 3/1998 |
| EP | 0905746 | 3/1999 |
| EP | 11-334874 | 12/1999 |
| EP | 0989600 | 3/2000 |
| JP | 53-076559 | 7/1978 |
| JP | 56-084618 | 7/1981 |
| JP | 56-084619 | 7/1981 |
| JP | 59-24849 | 2/1984 |
| JP | 60-005529 | 1/1985 |
| JP | 62-119543 | 5/1987 |
| JP | 63-077510 | 4/1988 |
| JP | 02-309638 A | 12/1990 |
| JP | 5-15857 | 1/1993 |
| JP | 06-177101 | 6/1994 |
| JP | 07-006993 | 1/1995 |
| JP | 11-350169 | 12/1999 |
| JP | 2001-064688 | 3/2001 |
| JP | 2002-66475 | 3/2002 |
| JP | 2002-280330 | 9/2002 |
| JP | 2002-309638 | 10/2002 |
| JP | 2003-282513 | 10/2003 |
| JP | 2005-194294 | 7/2005 |
| WO | WO-99/16109 | 4/1999 |
| WO | WO-2000/33980 | 6/2000 |
| WO | WO-00/59006 | 10/2000 |
| WO | WO-01/12384 | 2/2001 |
| WO | WO-02/101795 | 12/2002 |
| WO | WO-2005/006424 | 1/2005 |
| WO | WO 2005/064647 A1 | 7/2005 |

OTHER PUBLICATIONS

Aubert, JM et al.; "Aqueous foams"; Scientific America; 1986, 74-82, 254.

Kittle, et al.; "Semiconductor Wafer Cleaning and Drying Using a Foam Medium"; <http://www.aquafoam.com/papers;SCI0202.pdf>; Sematech Novel Wafer Cleans Working Group Meeting, Internet Presetation; Nov. 13, 2001.

Hunter; "Introduction to Modern Colloid Science"; Oxford University Press; Feb. 1, 1994.

Lester; "Is Foam Wafer Cleaning and Drying the Future?" <http://www.aquafoam.com/papers/SCI0202.pdf>; Semiconductor International, 25, #2; Feb. 1, 2002.

Kirkpatrick et al.; "Advanced Wafer-Cleaning Evolution"; Solid State Technology; May 1, 2003; www.solid-state.com.

Weaire et al.; "The Physics of Foams"; Department of Physics; Trinity Colloge, Dublin; 1999.

Kittle, et al.; "Photoreisist Removal Using Aqueous Foam"; Internet; http://www.aquafoam.com/paper/SCCPresentation.pdf.

Kittle, et al.; "Aqueous Foam Drying and Cleaning of Semiconductor Wafers"; Internet; http://www.aquafoam.com/paper/SCCPresentation.pdf.

Kittle, et al.; "Foam Wafer Cleaning—Experimental Proof of Concept"; Internet; http://www.aquafoam.com/paper/Removalall.pdf.

Kittle, et al.; "Particulate Removal Using a Foam Medium"; Internet; http://www.aquafoam.com/paper/particulate.pdf.

Kittle, et al.; "Photoresist Residue Removal Using Aqueous Foam Proof of Concept Experiments"; Internet; http://www.aquafoam.com/paper/Proof-11MB.pdf;<papers/A2C2photoresist.pdf>; 13-17; May 1, 2002.

Lide; "Air Composition"; CRC handbook of Chemistry and Physics; 1997.

U.S. Appl. No. 11/639,752, filed Dec. 15, 2006, Boyd et al.

U.S. Appl. No. 11/743,283, filed May 2, 2007, Freer et al.

Aubert, JM et al.; "Aqueous foams"; Scientific America; 1986, 74.

* cited by examiner

METHOD AND APPARATUS FOR UNIFORMLY APPLYING A MULTI-PHASE CLEANING SOLUTION TO A SUBSTRATE

APPLICATIONS FOR CLAIM OF PRIORITY

This application claims the benefit of U.S. Provisional Application No. 60/755,377, filed Dec. 30, 2005. Additionally, this application is a continuation-in-part of prior application Ser. No. 10/608,871, filed Jun. 27, 2003 now abandoned, and entitled "Method and Apparatus for Removing a Target Layer from a Substrate Using Reactive Gases." The disclosure of each of the above-identified applications is incorporated herein by reference.

CROSS REFERENCE TO RELATED APPLICATIONS

This application is related to U.S. patent application Ser. No. 10/816,337, filed on Mar. 31, 2004, and entitled "Apparatuses and Methods for Cleaning a Substrate," U.S. patent application Ser. No. 11/153,957, filed on Jun. 15, 2005, and entitled "Method and Apparatus for Cleaning a Substrate Using Non-Newtonian Fluids," U.S. patent application Ser. No. 11/154,129, filed on Jun. 15, 2005, and entitled "Method and Apparatus for Transporting a Substrate Using Non-Newtonian Fluid," U.S. patent application Ser. No. 11/174,080, filed on Jun. 30, 2005, and entitled "Method for Removing Material from Semiconductor Wafer and Apparatus for Performing the Same," U.S. patent application Ser. No. 10/746,114, filed on Dec. 23, 2003, and entitled "Method and Apparatus for Cleaning Semiconductor Wafers using Compressed and/or Pressurized Foams, Bubbles, and/or Liquids," U.S. patent application Ser. No. 11/336,215, filed on Jan. 20, 2006, entitled "Method and Apparatus far removing contamination from a substrate," U.S. patent application Ser. No. 11/346,894, filed on Feb. 3, 2006, entitled "Method for removing contamination from a substrate and for making a cleaning solution," and U.S. patent application Ser. No. 11/347,154, filed on Feb. 3, 2006, entitled "Cleaning compound and method and system for using the cleaning compound." The disclosure of each of the above-identified related applications is incorporated herein by reference.

BACKGROUND

In the fabrication of semiconductor devices such as integrated circuits, memory cells, and the like, a series of manufacturing operations are performed to define features on semiconductor wafers ("wafers"). The wafers include integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

During the series of manufacturing operations, the wafer surface is exposed to various types of contaminants. Essentially any material present in a manufacturing operation is a potential source of contamination. For example, sources of contamination may include process gases, chemicals, deposition materials, and liquids, among others. The various contaminants may deposit on the wafer surface in particulate form. If the particulate contamination is not removed, the devices within the vicinity of the contamination will likely be inoperable. Thus, it is necessary to clean contamination from the wafer surface in a substantially complete manner without damaging the features defined on the wafer. However, the size of particulate contamination is often on the order of the critical dimension size of features fabricated on the wafer. Removal of such small particulate contamination without adversely affecting the features on the wafer can be quite difficult.

Conventional wafer cleaning methods have relied heavily on mechanical force to remove particulate contamination from the wafer surface. As feature sizes continue to decrease and become more fragile, the probability of feature damage due to application of mechanical force to the wafer surface increases. For example, features having high aspect ratios are vulnerable to toppling or breaking when impacted by a sufficient mechanical force. To further complicate the cleaning problem, the move toward reduced feature sizes also causes a reduction in the size of particulate contamination that may cause damage. Particulate contamination of sufficiently small size can find its way into difficult to reach areas on the wafer surface, such as in a trench surrounded by high aspect ratio features or bridging of conductive lines, etc. Thus, efficient and non-damaging removal of contaminants during modern semiconductor fabrication represents a continuing challenge to be met by continuing advances in wafer cleaning technology. It should be appreciated that the manufacturing operations for liquid crystal displays (i.e., flat panel displays) suffer from the same shortcomings of the integrated circuit manufacturing discussed above.

Cleaning methods that use multi-phase cleaning solutions (i.e., foam, emulsions, etc.) that are comprised of a dispersed phase, continuous phase and solids overcome many of the problems associated with conventional wafer cleaning methods. When a force is applied against the multi-phase cleaning solution, the solids dispersed within the continuous phase come into contact or interact with the particulate contaminants on the wafer surface. As the cleaning solution, with the solids, is removed from the wafer surface the particulate contaminants are also removed.

There are several inherent challenges with using multi-phase cleaning solutions to clean wafer surfaces. One is that it is difficult to ensure that the solution is uniformly applied across the entire wafer surface. Uneven application of the solution may result in an uneven cleaning profile on the wafer surface due to non-uniform rinsing of the wafer surface. Another is that it is difficult to uniformly apply force against the solution across the wafer surface so that the embedded solids actually come into contact with the contaminant particulates during cleaning. As discussed earlier, the solids must come within the vicinity of the contaminant particles before they can interact and effectuate the removal of the particles.

In view of the forgoing, there is a need for an apparatus and method for uniformly applying a multi-phase cleaning solution (i.e., foam, emulsions, etc.) across a wafer surface during the cleaning of the wafer surfaces.

SUMMARY

Broadly speaking, the present invention fills these needs by providing improved apparatuses, methods, and systems for uniformly applying a multi-phase cleaning solution (i.e., foam, emulsions, etc.) across a wafer surface during the cleaning of the wafer surfaces. It should be appreciated that the present invention can be implemented in numerous ways, including as an apparatus, a method and a system. Several inventive embodiments of the present invention are described below.

In one exemplary embodiment, an apparatus used to supply a force onto a cleaning solution for processing a substrate for cleaning surface contaminants is disclosed. The apparatus includes a force applicator and a gate. The force applicator is configured to be adjusted to a first height off the surface of the substrate. The gate is positioned adjacent to a trailing point of the force applicator and is configured to be adjusted to a second height off of the surface of the substrate to enable planarization of the cleaning solution as the solution moves to the trailing point.

In another embodiment, a method for processing a substrate for cleaning surface contaminants is disclosed. A cleaning solution is applied to the surface of the substrate. The cleaning solution having a dispersed phase, a continuous phase and solids dispersed within the continuous phase. A force is applied against the cleaning solution. The force at least partially controls the containment of the cleaning solution and subjects it to a substantially planar profile over the surface of the substrate.

In still another embodiment, a system for cleaning a substrate having surface contaminants is disclosed. The system includes a cleaning station having a substrate carrier, a force applicator and a gate. The substrate carrier is capable of holding the substrate and is configured to move translationally from one cleaning station to another. The force applicator is operatively connected to the cleaning station, wherein the force applicator is configured to rotate and be adjusted to a first height off the top surface of a substrate and supply a force against a cleaning solution on the top surface of the substrate. The gate is operatively connected to the cleaning station and is configured to planarize the cleaning solution to a second height off of the top surface of the substrate.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention is described for apparatuses, methods, and systems for uniformly applying a multi-phase cleaning solution (i.e., foam, emulsions, etc.) across a wafer surface during the cleaning of the wafer surfaces. It will be obvious, however, to one skilled in the art, that the present invention may be practiced without some or all of these specific details. In other instances, well known process operations have not been described in detail in order not to unnecessarily obscure the present invention.

As used herein, a multi-phase cleaning solution includes a continuous phase, dispersed phase and solids which are disseminated throughout the continuous phase. In one embodiment, the dispersed phase refers to gas bubbles that are dispersed throughout the continuous phase (e.g., foam). In another embodiment, the dispersed phase refers to liquid droplets that are dispersed throughout the continuous phase (e.g., emulsion). In one embodiment, the dispersed phase provides an intermediary to bring solids in close proximity with contaminant particles on a substrate surface. For further explanation of the composition of the cleaning solution and its mechanisms see U.S. patent application Ser. No. 11/346,894, filed on Feb. 3, 2006, entitled "Method for removing contamination from a substrate and for making a cleaning solution," U.S. patent application Ser. No. 11/347,154, filed on Feb. 3, 2006, entitled "Cleaning compound and method and system for using the cleaning compound" and U.S. patent application Ser. No. 11/336,215, filed on Jan. 20, 2006, entitled "Method and Apparatus for removing contamination from a substrate." The solids interact with the particles during cleaning to effectuate their removal. A substrate, as used herein, denotes both semiconductor wafers and flat panel display surfaces (e.g., liquid crystal displays, etc.) that may become contaminated during manufacturing operations.

Figure 1A:
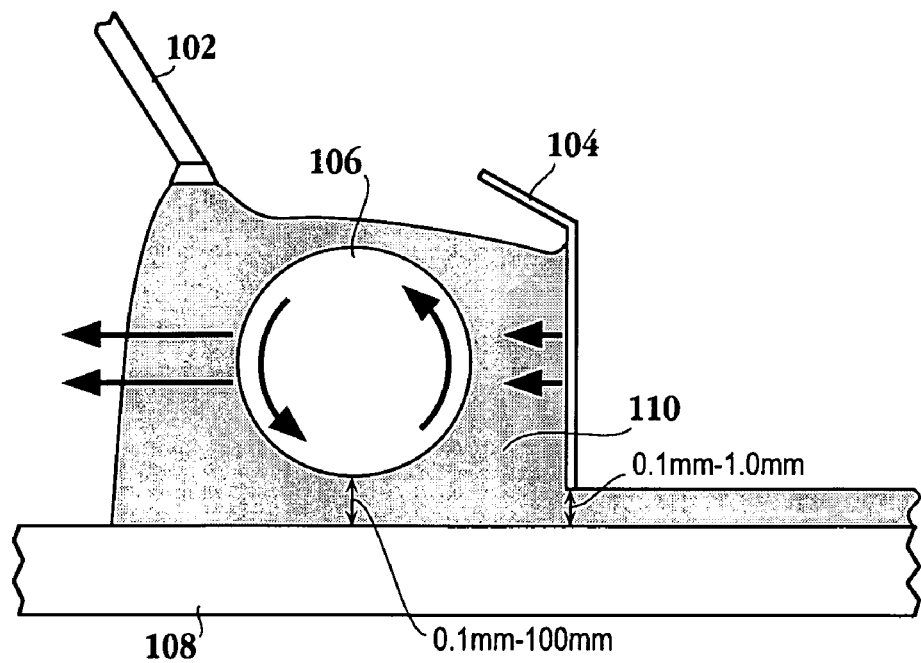
FIG. 1A is a side view of an apparatus for uniformly applying a multi-phase cleaning solution (i.e., foam, emulsions, etc.) across the surface of a substrate, in accordance with one exemplary embodiment of the present invention.

FIG. 1A is a side view of an apparatus for uniformly applying a multi-phase cleaning solution (i.e., foam, emulsions, etc.) across the surface of a substrate, in accordance with one exemplary embodiment of the present invention. As depicted in this embodiment, the apparatus includes a force applicator 106 and a gate 104. The force applicator 106 is configured to apply a force uniformly against the cleaning solution 110 as the applicator 106 moves in parallel fashion across the surface of the substrate 108. Typically, the force applicator 106 is positioned so that the distance between the applicator 106 and the surface of the substrate 108 is between about 0.1 millimeter (mm) and 10 centimeters (cm). The gate 104 is configured to follow the trailing edge of the force applicator 106 and to substantially planarize the cleaning solution 110 as it moves across the surface of the substrate 108. Typically, the gate 104 is positioned so that the distance between the gate 104 and the surface of the substrate 108 is between about 0.1 mm and 5.0 mm. In one embodiment, the force applicator 106 and gate 104 are positioned at about the same distance off the substrate surface.

In one embodiment, the force applicator 106 and the gate 104 are configured to operate in unison when moving across the substrate 108. Therefore, as the force applicator 106 and gate 104 moves across the surface of the substrate 108, the cleaning solution 110 is simultaneously being applied against the surface of the substrate 108 and planarized so that the solution 110 assumes a uniform thickness profile on the substrate surface. In another embodiment, the force applicator 106 moves independently from the gate 104.

As depicted in the present embodiment, the force applicator 106 is in the shape of a cylindrical drum and positioned so that the axis of rotation of the applicator 106 is parallel to the surface of the substrate 108. It should be understood that the force applicator 106 can take any shape so long as the applicator 106 can be utilized to uniformly apply a cleaning solution 110 to the surface of a substrate 108. In one embodiment, the force applicator 106 is a solid and smooth structure without any internal cavity regions. In another embodiment, the force applicator 106 is a hollow structure with internal channels and multiple openings dispersed throughout the surface of the applicator 106. The channels and openings being configured to dispense a cleaning solution 110 or other liquids to the surface of the substrate 108 during cleaning operations. In one embodiment, the force applicator 106 is made out of polyvinyl alcohol (PVA) foam. Some examples of other materials that the applicator 106 can be made out of include polymers (e.g., Teflon™, polyvinyl alcohol, polyurethane, polytetrafluoroethylene, polyethylene terephthalate, polyvinylidine difluoride, polyetheretherketone, polyvinyl chloride, etc.), rubber, ceramics, stainless steel, tool steel, and aluminum. It should be appreciated that the force applicator 106 can be made out of essentially any material so long as the material is non-reactive with the cleaning solution 110 and can function to uniformly apply a force against the solution 110 on the surface of a substrate 108.

Continuing with FIG. 1A, in the present embodiment, the gate 104 is positioned substantially orthogonal to the surface of the substrate 108 and bent at a 45 degree angle towards the top of the force applicator 106. However, it should be understood that the gate 104 can be positioned in essentially any fashion and bent in any angle so long as the gate 104 can function to planarize the cleaning solution 110 on the substrate 108 surface. In one embodiment, the gate 104 is a solid structure without an internal cavity region. In another embodiment, the gate 104 is a hollow structure. Some examples of materials that that the gate 104 can be made out of include glass, stainless steel, aluminum, ceramics, rubber, and polymers (e.g., Teflon™, polyvinyl alcohol, polyurethane, polytetrafluoroethylene, polyethylene terephthalate, polyvinylidine difluoride, polyetheretherketone, polyvinyl chloride, etc.). It should be appreciated, however, that the gate 104 can be made of any material so long as the material is non-reactive with the cleaning solution 110 and does not hinder the planarization of the cleaning solution 110 on the surface of the substrate 108.

As depicted in the present embodiment, a cleaning solution 110 dispenser 102 is positioned proximate to the leading edge of the force applicator 106. As the force applicator 106 rotates, the dispenser 102 supplies the multi-phase cleaning solution 110 directly to the substrate surface. In one embodiment, the solution 110 is applied directly to the force applicator 106. Then by virtue of the force applicator 106 rotation, the cleaning solution 110 is applied against the surface of the substrate 108. In one embodiment, the dispenser 102 is configured to move in unison with the force applicator 106 and the gate 104 across the substrate surface during a cleaning operation. In one embodiment, the force applicator 106 is configured to rotate towards the surface of the substrate 108. In another embodiment, force applicator 106 is configured to rotate away from the top surface of the substrate 108. The rotational velocity of the force applicator 106 can be set to any value so long as the cleaning solution 110 is applied to the substrate surface with sufficient force to effectuate the desired cleaning of the substrate surface without losing an unacceptable amount of the cleaning solution 110.

Figure 1B:
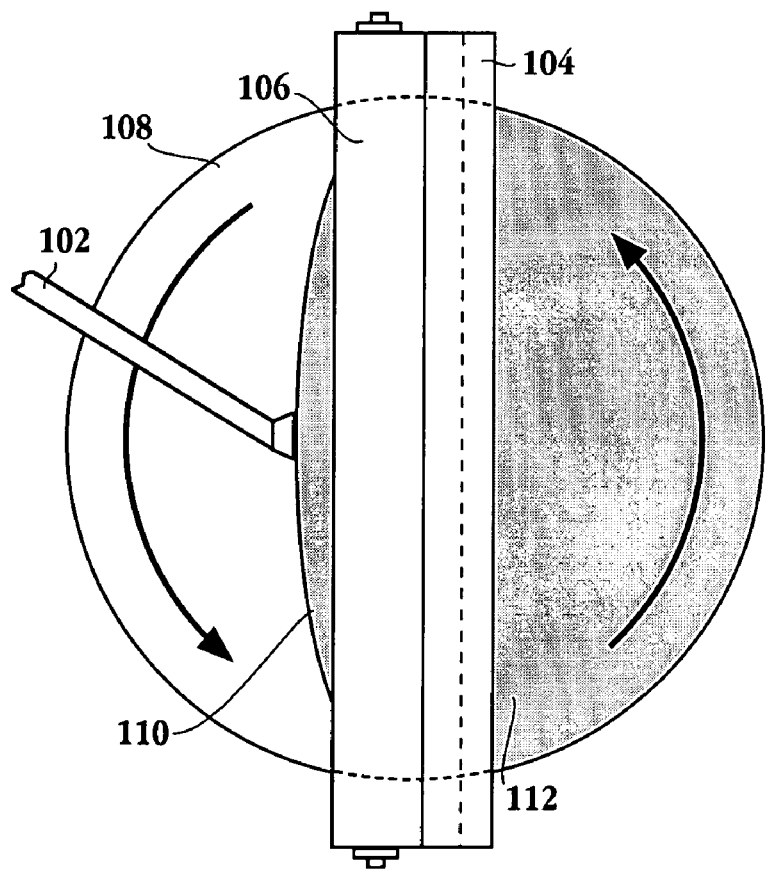
FIG. 1B shows a top view of the apparatus, in accordance with one embodiment of the present invention.

FIG. 1B shows a top view of the apparatus, in accordance with one embodiment of the present invention. As depicted in this embodiment, the force applicator and gate 104 are shown to stretch lengthwise to cover the entire diameter of the substrate 108. The dispenser 102 is shown as a nozzle that is positioned towards the midpoint of the force applicator 106 and configured to supply the cleaning solution 110 to the leading edge of the applicator 106. In one embodiment, the dispenser 102 is a manifold that stretches the entire length of the force applicator 106 and configured to supply the cleaning solution 110 directly to the substrate surface. In another embodiment, the dispenser 102 is the manifold as described above and configured to supply the cleaning solution 110 to both the substrate surface and the applicator 106.

As depicted in the present embodiment, the substrate 108 is rotated in a counter-clockwise direction as the force applicator 106 and gate 104 moves across the surface of the substrate 108. In one embodiment, the substrate 108 is rotated in a clockwise direction as the force applicator 106 and gate 104 moves across the substrate surface. Typically, the substrate 108 rotates at between about 4 and 8 rotations per minute (rpm).

Figure 2A:
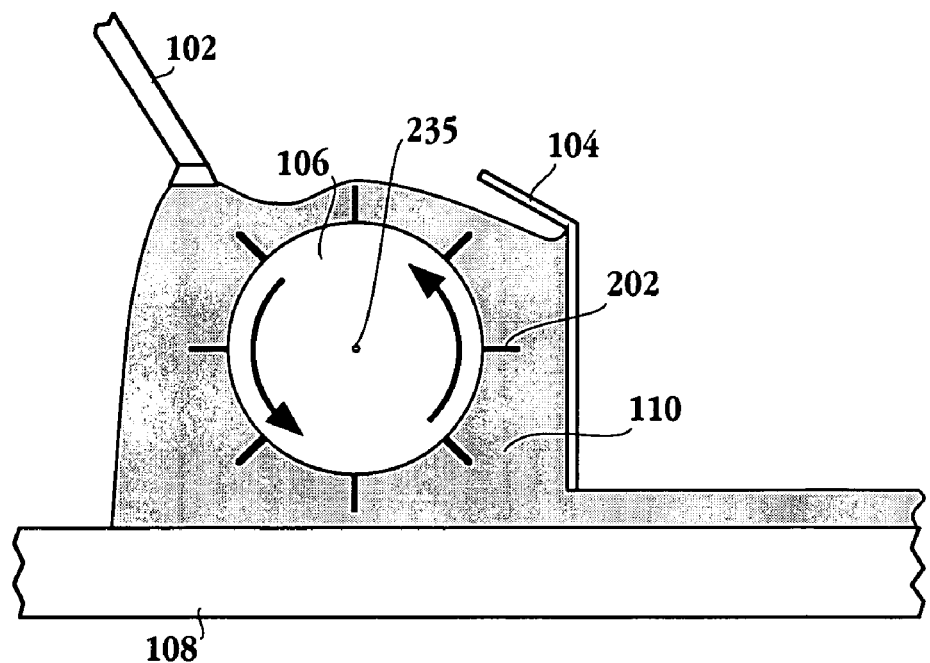
FIG. 2A shows a cross-sectional view of a force applicator and gate, in accordance with one embodiment of the present invention.

FIG. 2A shows a cross-sectional view of a force applicator and gate, in accordance with one embodiment of the present invention. As depicted in this embodiment, the force applicator 106 includes a plurality of baffles 202 that protrude out from the applicator 106 and are aligned with the axis of rotation 235 of the force applicator 106. The baffles 202 are configured to drive the cleaning solution 110 against the substrate surface by supplying a sweeping action that carries and forces the cleaning solution 110 against the substrate surface. In one embodiment, the baffles 202 are evenly spaced from one another. In another embodiment, the baffles 202 are randomly spaced from one another.

It should be appreciated that the baffles 202 can be designed so that they protrude out from the applicator 106 at any angle, relative to the longitudinal surface of the force applicator 106, so long as the baffles 202 can function to drive the cleaning solution 110 against the substrate surface with sufficient force to effectuate the desired cleaning. In one embodiment, the force applicator 106 includes a series of channels that travel the length of the applicator 106 and serve the same function as the baffles 202. In one embodiment, the baffles 202 are affixed to the force applicator 106 using an adhesive material. Examples of materials that can be used to make the baffles 202 include rubber, ceramics, polymers (i.e., Teflon™, polyvinyl alcohol, polyurethane, polytetrafluoroethylene, polyethylene terephthalate, polyvinylidine difluoride, polyetheretherketone, polyvinyl chloride, etc.), and solid metals (i.e., aluminum, steel, etc.).

Continuing with FIG. 2A, in the present embodiment, the gate 104 is placed proximate to the force applicator 106 at a trailing position that is far enough away from the baffles 202 so that the baffles 202 do not contact the gate 104. Additionally, the force applicator 106 is positioned so that the baffles 202 do not contact the surface of the substrate 108. Typically, the applicator 106 maintains a distance of between about 0.1 mm and 100 mm off the substrate surface. The force applicator 106 is configured to rotate towards the substrate surface.

Figure 2B:
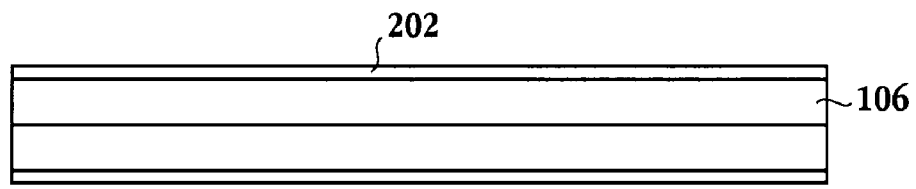
FIG. 2B is an illustration showing a side view of a force applicator with a straight line baffle pattern, in accordance with one embodiment of the present invention.

FIG. 2B is an illustration showing a side view of a force applicator with a straight line baffle pattern, in accordance with one embodiment of the present invention. In this embodiment, the baffles 202 are shown as stretching uninterrupted in linear fashion along the longitudinal surface of the force applicator 106. It should be understood that the width (distance the baffle protrudes from the force applicator 106) and thickness of the baffles 202 can vary in accordance with the particular cleaning application that the force applicator 106 is utilized for. In one embodiment, each baffle includes intermittent gaps or openings.

Figure 2C:
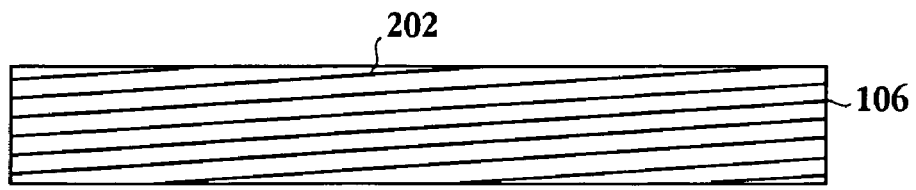
FIG. 2C is a depiction of a side view of a force applicator with a diagonal baffle pattern, in accordance with one embodiment of the present invention.

FIG. 2C is a depiction of a side view of a force applicator with a diagonal baffle pattern, in accordance with one embodiment of the present invention. In this embodiment, the baffles 202 are shown as diagonal lines stretching along the length of the force applicator 106. It should be understood that the baffle patterns can take any form so long as the resulting baffle pattern can adequately drive a cleaning solution 110 against the substrate surface with sufficient force to effectuate the desired cleaning profile.

Figure 3A:
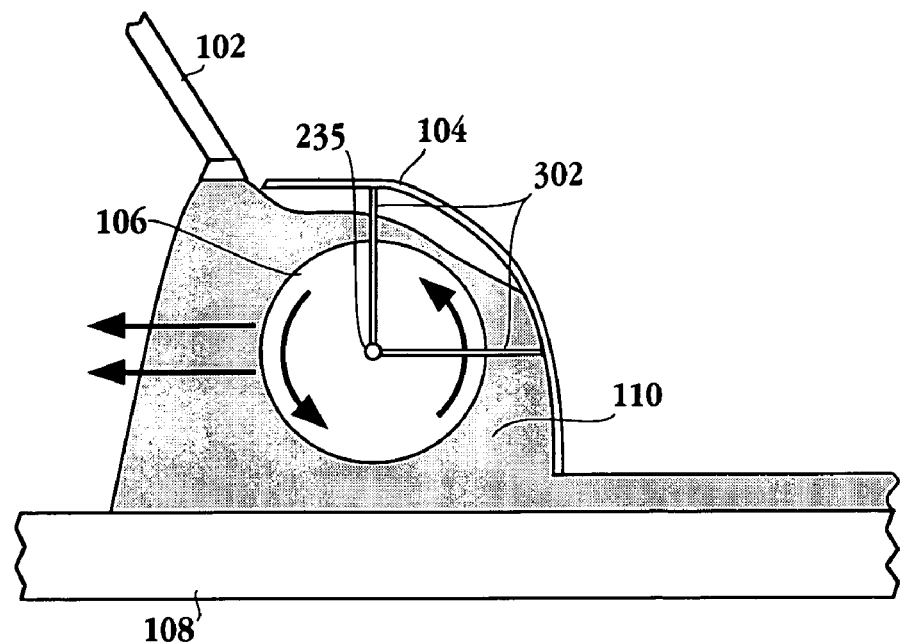
FIG. 3A is an illustration of a side view of an apparatus for uniformly applying a multi-phase cleaning solution across the surface of a substrate 108, in accordance with one embodiment of the present invention.

FIG. 3A is an illustration of a side view of an apparatus for uniformly applying a multi-phase cleaning solution across the surface of a substrate 108, in accordance with one embodiment of the present invention. As depicted in this embodiment, the apparatus includes a gate 104 that is affixed to the force applicator 106 via arm extensions 302 that are operatively connected to the rotational axes on the edge surfaces of the force applicator 106. The gate 104 has a partial annular shape that arches from just above the substrate surface to just over the top surface of the force applicator 106. A cleaning solution dispenser 102 is attached to the portion of the gate 104 positioned over the force applicator 106. The dispenser 102 is configured to supply a cleaning solution 110 simultaneously to the applicator 106 and the substrate surface. In one embodiment, the dispenser 102 is detached from the gate 104 and configured so that the position of the dispenser 102 can be adjusted depending on the requirements of the cleaning application.

As depicted herein, the arm extensions 302 are shown to be affixed to two points on the gate 104 and the rotational axis 235 of the force applicator 106. The gate 104 and force applicator 106 move in unison parallel to the substrate surface, uniformly applying a force (using the force applicator 106) against the cleaning solution 110 and planarizing (using the gate 104) the cleaning solution 110 on the substrate surface. In one embodiment, the gate 104 is attached to the force applicator 106 via a single point of contact. For example, the gate 104 can be attached via a single arm extension to the axis of rotation 235 on both sides of the force applicator 106. In another embodiment, the gate 104 is attached to the force applicator 106 via a plurality of arm extensions 302 at a plurality of points on the gate 104. In one embodiment, the arm extensions 302 are configured to enable the adjustment of the distance of the gate 104 relative to the substrate surface. As discussed above, typically, the gate 104 is positioned so that the distance between the gate 104 and the surface of the substrate 108 is between about 0.1 mm and 5.0 mm.

Figure 3B:
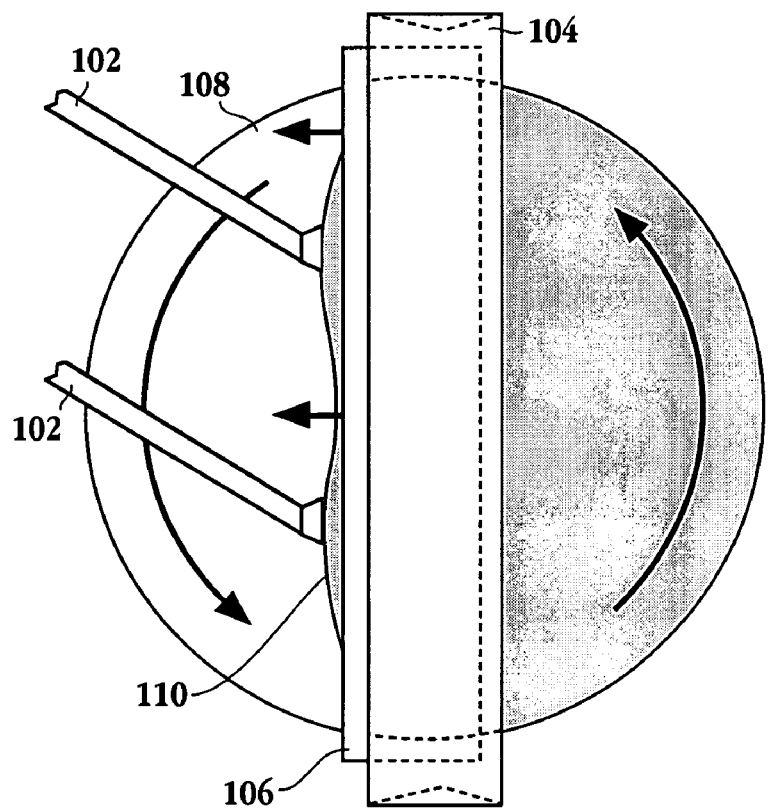
FIG. 3B is an illustration showing a top view of an apparatus for uniformly applying a multi-phase cleaning solution across the surface of a substrate, in accordance with one embodiment of the present invention.

FIG. 3B is an illustration showing a top view of an apparatus for uniformly applying a multi-phase cleaning solution across the surface of a substrate, in accordance with one embodiment of the present invention. As depicted in this embodiment, the gate 104 is shown to be affixed to the side surfaces of the leading edge of the force applicator 106. Two cleaning solution dispensers 102 are positioned proximate to the force applicator 106 and are configured to supply the cleaning solution 110 to the substrate surface adjacent to the force applicator 106. In this embodiment, the gate 104 is shown to overlap the two sides of the force applicator 106. It should be understood that the length of the gate 104 relative to the force applicator 106 may vary so long as the gate 104 can adequately function to planarize the cleaning solution 110 across the entire length of the substrate 108 as the gate 104 moves across the substrate surface.

Figure 4A:
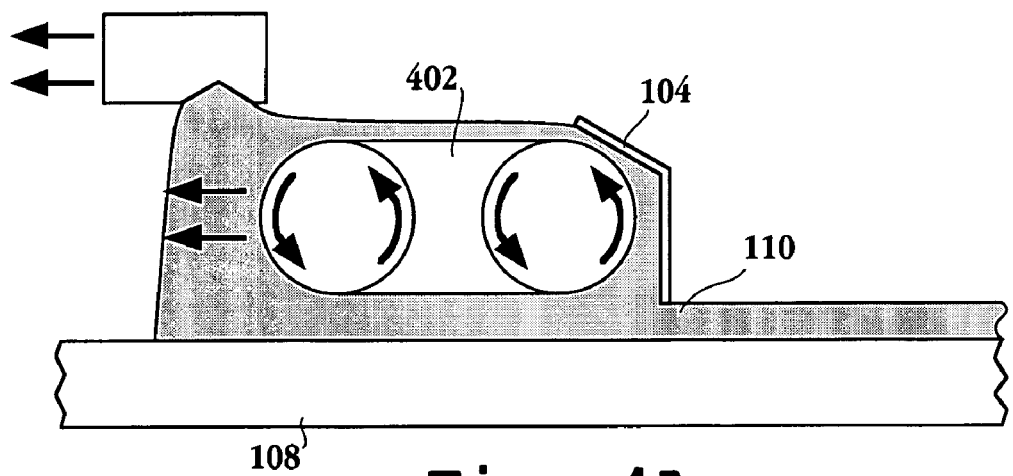
FIG. 4A is an illustration of a side view of an apparatus for uniformly applying a multi-phase cleaning solution 110 across the surface of a substrate 108, in accordance with one embodiment of the present invention.

FIG. 4A is an illustration of a side view of an apparatus for uniformly applying a multi-phase cleaning solution 110 across the surface of a substrate 108, in accordance with one embodiment of the present invention. In this embodiment, the apparatus includes a force applicator 402 and a gate 104. The force applicator 402 includes two cylindrical drums that are encased by a flexible sheet. The cylindrical drums are configured to rotate in unison and impart a force to the flexible sheet so that the sheet rotates around both drums. It should be appreciated that the force applicator 402 can include any number of drums so long as the resulting applicator 402 can function to supply enough force to effectuate the desired cleaning of the substrate surface. Examples of materials that can be used to make the flexible sheet include polymers (e.g Teflon™, polyvinyl alcohol, polyurethane, polytetrafluoroethylene, polyethylene terephthalate, polyvinylidine difluoride, polyetheretherketone, polyvinyl chloride, etc.) and rubber. However, it should be understood that essentially any flexible material can be used to make the sheet so long as the material does not chemically react with the cleaning solution 110 and can effectuate the desired cleaning of the substrate surface.

Figure 4B:
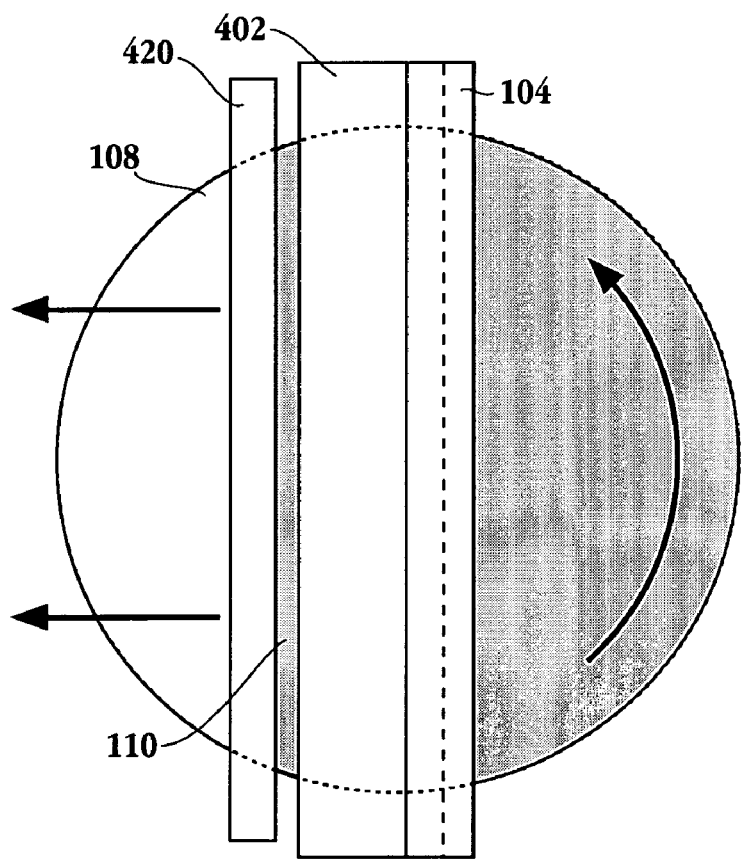
FIG. 4B is an illustration of a top view of an apparatus for uniformly applying a multi-phase cleaning solution across the surface of a substrate, in accordance with one embodiment of the present invention.

FIG. 4B is an illustration of a top view of an apparatus for uniformly applying a multi-phase cleaning solution across the surface of a substrate, in accordance with one embodiment of the present invention. As depicted in this embodiment, force applicator 402 and gate 104 are shown to stretch lengthwise to cover the entire diameter of the substrate 108. The cleaning solution manifold 420 is positioned adjacent to the force applicator 402 and also stretches lengthwise to cover the entire diameter of the substrate surface. In one embodiment, the manifold stretches lengthwise to cover only a portion of the diameter of the substrate surface. As depicted, the manifold 420 is configured to supply the cleaning solution 110 directly to the substrate surface as the substrate 108 is being rotated at between about 4 to 8 revolutions a minute. In one embodiment, the manifold 420 is configured to supply the cleaning solution 110 to both the substrate surface and the force applicator 402.

In one embodiment, the manifold 420 is configured to be attached to the force applicator 402 and to move in unison with the applicator 402 and gate 104 across the substrate 108. In another embodiment, the manifold 420 is detached from the force applicator 402 but configured to move in unison with the force applicator 402 and gate 104 across the substrate 108.

Figure 5A:
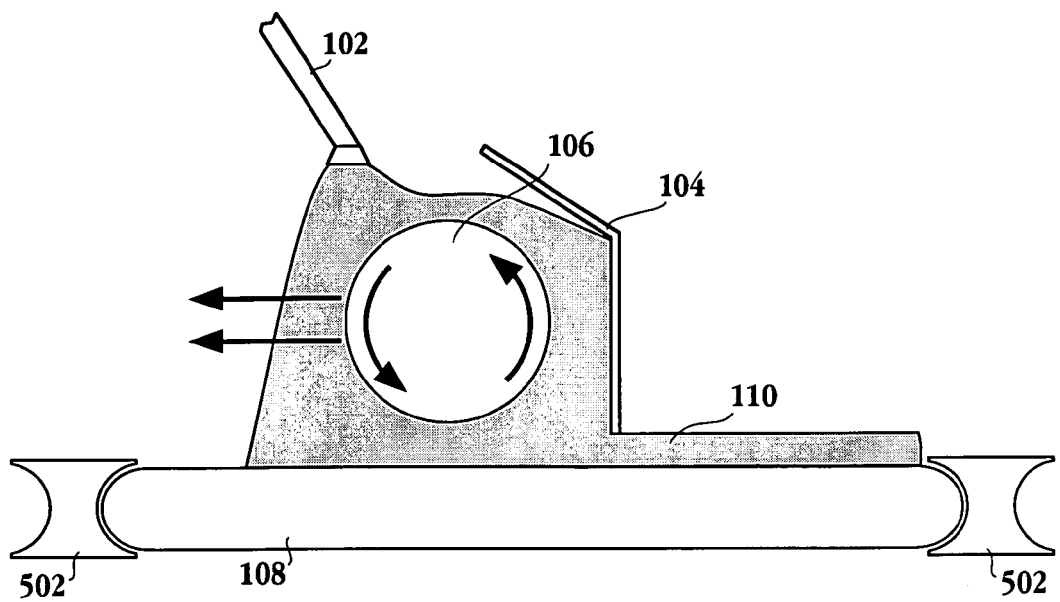
FIG. 5A is an illustration of a side view of a plurality of powered rollers supporting and rotating a substrate as a force applicator and gate uniformly applies a multi-phase cleaning solution across the surface of the substrate, in accordance with one embodiment of the present invention.

FIG. 5A is an illustration of a side view of a plurality of powered rollers supporting and rotating a substrate as a force applicator and gate uniformly applies a multi-phase cleaning solution across the surface of the substrate, in accordance with one embodiment of the present invention. In this embodiment, the substrate 108 is shown as being supported by a plurality of powered rollers 502 that are configured to impart a set rotational velocity to the substrate 108 as the force applicator 106 and gate 104 moves across the surface of the substrate 108. Typically, the rollers 502 are configured to rotate the substrate 108 at between about 4 and 8 rpm depending on the requirements of the cleaning application.

Figure 5B:
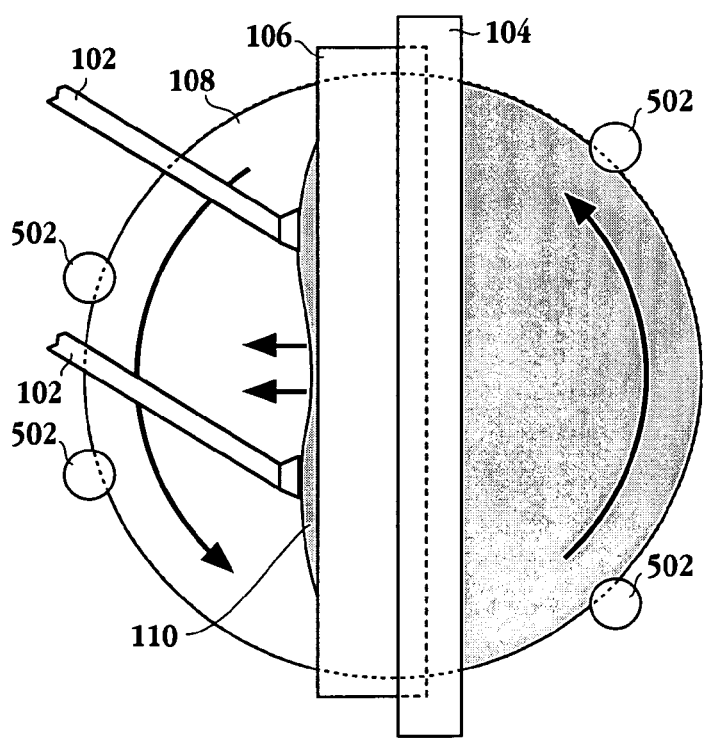
FIG. 5B is an illustration of a top view of a set of four powered rollers supporting and rotating a substrate as a force applicator and gate uniformly applies a multi-phase cleaning solution across the surface of the substrate, in accordance with one embodiment of the present invention.

FIG. 5B is an illustration of a top view of a set of four powered rollers supporting and rotating a substrate as a force applicator and gate uniformly applies a multi-phase cleaning solution across the surface of the substrate, in accordance with one embodiment of the present invention. As depicted in this embodiment, the substrate 108 is supported by a set of four powered rollers 502 spaced along the circumference of the substrate 108. It should be understood that fewer or greater numbers of powered rollers 502 may be utilized so long as the substrate 108 is adequately supported during cleaning operations and the rollers 502 are capable of imparting the required rotational velocity to the substrate 108.

Figure 5C:
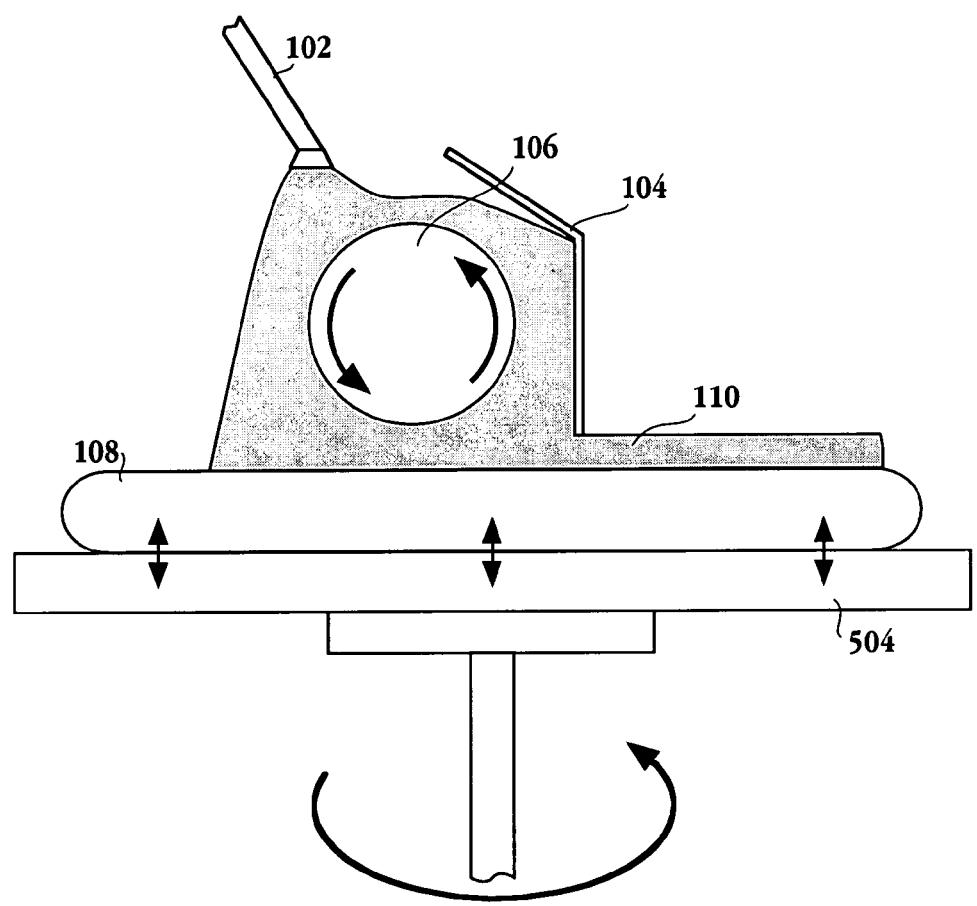
FIG. 5C is an illustration of a side view of a vacuum chuck used to support and rotate a substrate as a force applicator and gate uniformly applies a multi-phase cleaning solution across the surface of the substrate, in accordance with one embodiment of the present invention.

FIG. 5C is an illustration of a side view of a vacuum chuck used to support and rotate a substrate as a force applicator and gate uniformly applies a multi-phase cleaning solution across the surface of the substrate, in accordance with one embodiment of the present invention. As depicted in this embodiment, the substrate 108 is supported by a vacuum chuck 504 that is configured to impart a rotational velocity of between about 4 to 8 rpm to the substrate 108 and provide a vacuum against the bottom surface of the substrate 108 to bind the substrate 108 to the surface of the chuck 504 during cleaning operations. In one embodiment, the chuck 504 emits an electrostatic force to bind the substrate 108 to the surface of the chuck 504 during cleaning. In another embodiment, the chuck 504 provides a layer of adhesive material that binds to the bottom of the substrate 108.

Figure 6A:
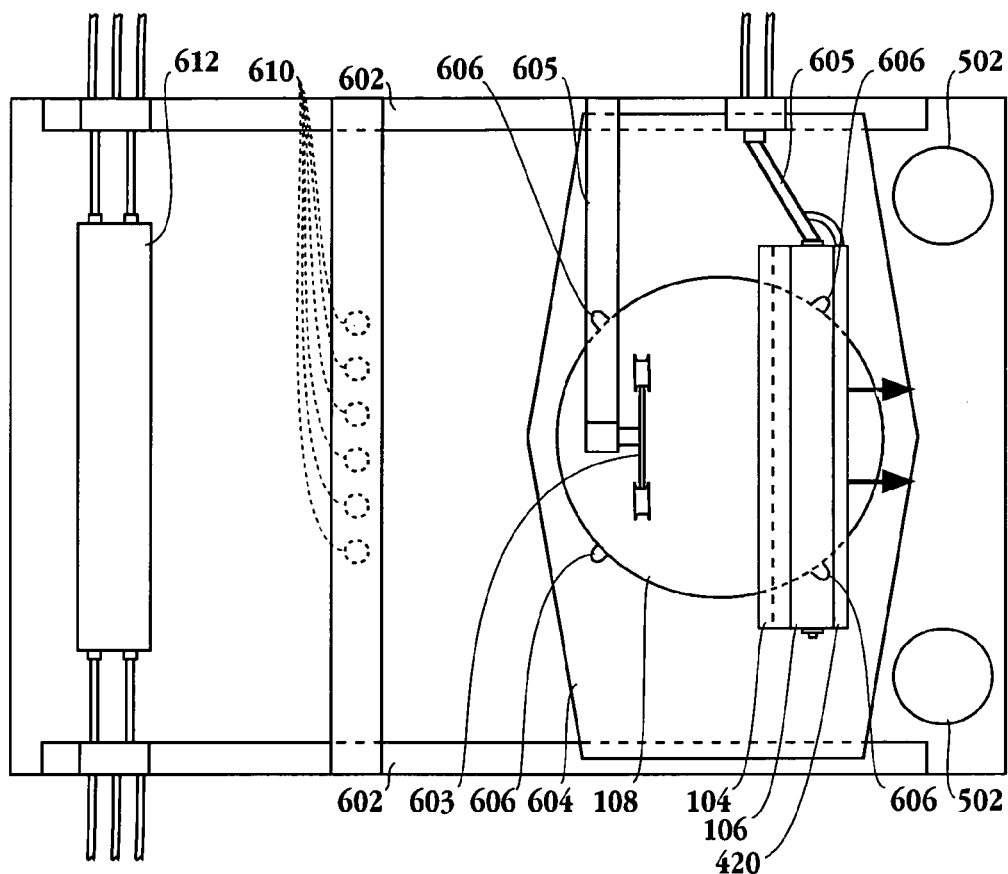
FIG. 6A is an illustration of a top view of a system for cleaning a substrate having surface contaminants, in accordance with one exemplary embodiment of the present invention.

FIG. 6A is an illustration of a top view of a system for cleaning a substrate having surface contaminants, in accordance with one exemplary embodiment of the present invention. In this embodiment, the system includes three distinct cleaning zones. The first zone includes a pair of powered rollers 502 affixed to the base of the system containment housing 620, a force applicator 106, a gate 104 affixed to the trailing edge of a force applicator 106, a manifold 420 affixed to the leading edge of the force applicator 106, and a tandem roller unit 603. The second zone includes six rinse nozzles 610 that are positioned above the substrate 108 and configured to dispense a liquid to rinse a cleaning solution 110 from the top surface of the substrate 108 as the substrate 108 moves underneath the nozzles 610. Examples of liquids that can be dispensed by the nozzles 610 include Deionized Water (DIW), Ammonium Peroxide ($NH_4OH$), Hydrogen Peroxide ($H_2O_2$), and SC-1 solution ($NH_4OH/H_2O_2/H_2O$). However, it should be understood that essentially any liquid can be used so long as the liquid can adequately remove the cleaning solution 110 from the substrate surface per the requirements of the cleaning operation. The third zone includes a plurality of proximity head units 612 that are configured to effectuate a final cleaning and drying of the top and/or bottom surfaces of the substrate 108. A description of proximity head units and their method of operation can be found in co-pending application Ser. No. 10/261,839 entitled, "Method and Apparatus for Drying Semiconductor Wafer Surfaces Using a Plurality of Inlets and Outlets Held in Close Proximity to the Wafer Surfaces" published in 2004-0069329A1, co-pending application Ser. No. 10/330,843 entitled "Meniscus, Vacuum, IPA Vapor, Drying Manifold" published in 2004-0060580A1 as well as U.S. Pat. Nos. including 6,988,327, 6,954,993, and 6,988,326 all assigned to Lam Research Corporation and are incorporated herein by reference.

In one embodiment, the force applicator 106, gate 104, rinse nozzles 610, and proximity head units 612 are configured to operate within a single cleaning zone. It should be appreciated that the system containment housing 620 can be configured to have cleaning zones that are different from those described in this embodiment. The types (e.g., bevel edge cleaning, surface cleaning with brushes, etc.) and numbers of cleaning zones that can be incorporated into the system housing 620 is limited only by their operational compatibility with the force applicator 106/gate 104 unit and the space available in the system containment housing 620.

As depicted in FIG. 6A, a substrate carrier 604 is provided which includes an opening sized to fit a substrate 108 and includes four clips 606 that are configured to support the substrate 108 during transport between one zone and another. The substrate carrier 604 moves on top of two guide tracks 602 that run the length of the system containment housing across all three cleaning zones. In one embodiment, the substrate carrier 604 does not have an opening for the substrate 108 but instead has a plurality of clips 606 that are configured to support the substrate 108 in an elevated profile off the top surface of the substrate carrier 604. In one embodiment, the carrier 604 runs on a plurality of powered wheels that are configured to move the carrier 604 from one cleaning zone to the next. In another embodiment, the carrier 604 is driven by a motorized chain belt system mounted adjacent to one of the guide tracks 602 in the containment housing.

Continuing with FIG. 6A, the force applicator with the affixed gate and manifold dispenser is mounted on a mechanical arm 605 that is attached to the side wall of the containment housing. The mechanical arm 605 is configured to move the applicator 106, gate 104, and manifold dispenser 420 in unison across the substrate surface. Concurrent with moving across the substrate 108, the manifold dispenser is configured to supply a cleaning solution 110 to the substrate surface proximate to the leading edge of the applicator 106. As the applicator 106 comes into contact with the cleaning solution 110, the applicator 106 is configured to rotate and supply a force against the cleaning solution 110 uniformly across the diameter of the substrate 108. The gate 104 affixed to the trailing edge of the applicator 106 is configured to planarize the cleaning solution 110 to a predetermined height off the substrate surface as it moves across the substrate 108. In one embodiment, the motorized arm 605 is configured to allow adjustment of the distance (typically between about 0.1 mm and 100 mm) that the applicator 106 and gate 104 sits above the substrate surface. In one embodiment, the applicator 106, gate 104, and manifold dispenser are mounted on a motorized carrier 604 that is configured to move translationally across the substrate surface.

As depicted in the embodiment shown in FIG. 6A, a plurality of chemical feed lines are attached to the manifold dispenser 420 and the mechanical arm 605. The chemical feed lines are configured to supply the cleaning solution 110 that is dispensed by the manifold dispenser. In one embodiment, the chemical feed lines are configured to supply cleaning solution 110 to one or more spray dispensers that are affixed to the force applicator 106.

Still with FIG. 6A, the tandem roller unit 603 includes two rollers and is affixed to a mechanical arm 605. The mechanical arm 605 is configured to rotate the unit towards the base of the containment housing and align the rollers to the edge of the substrate 108. The rollers are configured to provide support for the substrate 108. In one embodiment, the rollers are powered and configured to impart a rotational velocity to the substrate 108 of between about 4 and 8 rpm. In another embodiment, the rollers are not powered and are configured to rotate freely as the substrate 108 is rotated by the powered rollers 502.

Figure 6B:
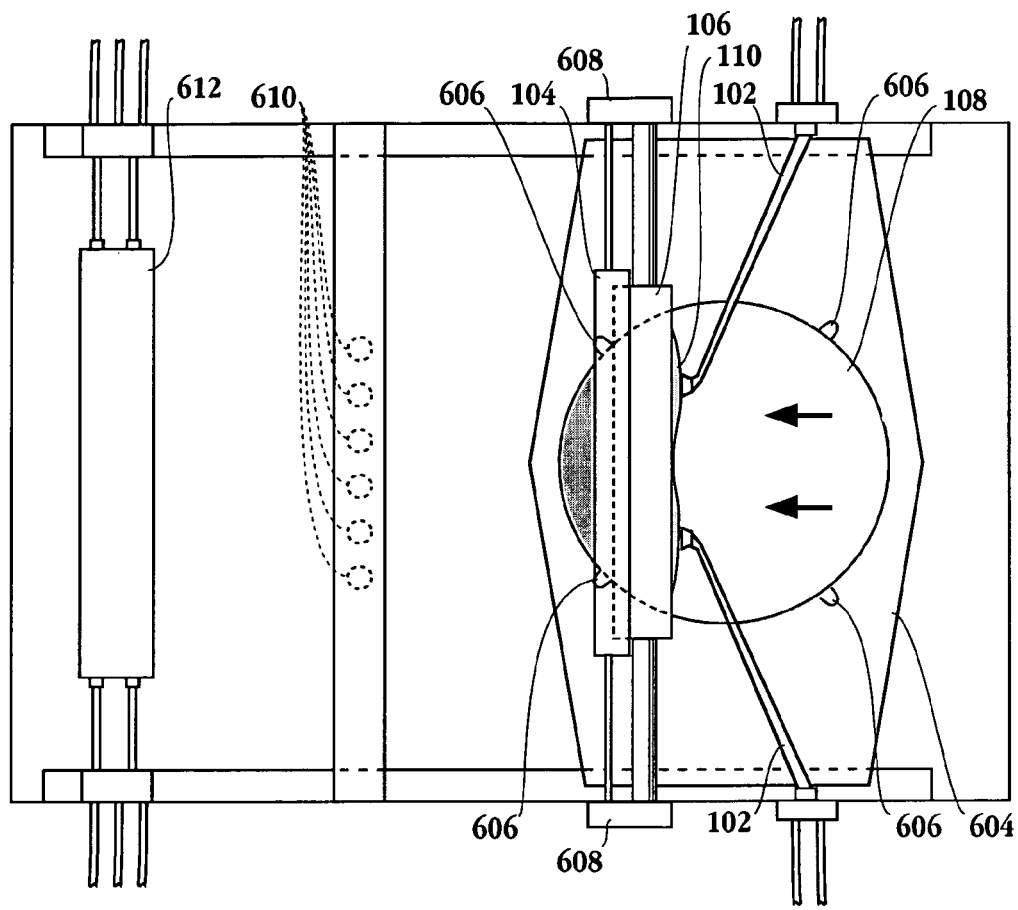
FIG. 6B is an illustration of a top view of a system for cleaning a substrate having surface contaminants, in accordance with one embodiment of the present invention.

FIG. 6B is an illustration of a top view of a system for cleaning a substrate having surface contaminants, in accordance with one embodiment of the present invention. As with the system discussed above, the system depicted in this embodiment includes three distinct cleaning zones. The first zone includes a force applicator 106, a gate 104 positioned at the trailing edge of a force applicator 106, and two cleaning solution dispensers 102 positioned adjacent to the leading edge of the force applicator 106. The second cleaning zone includes six rinse nozzles that are positioned above the substrate surface and configured to dispense a liquid to rinse a cleaning solution 110 off the top surface of the substrate 108 as the substrate 108 moves underneath the nozzles. The third zone includes proximity head units that are configured to effectuate a final cleaning and drying of the top and/or bottom surfaces of the substrate 108.

As depicted in FIG. 6B, the force applicator 106 is attached to motorized drive units 608 on both sides of the system containment unit. The motorized drive units 608 are configured to rotate the force applicator 106 towards the substrate surface during a cleaning operation. As the substrate carrier 604 transports the substrate 108 translationally from the first cleaning zone to the second cleaning zone, the force applicator 106 is configured to uniformly apply a force against the cleaning solution 110 on the substrate surface. In one embodiment, the motorized drive units 608 are configured to enable adjustment of the vertical distance that the force applicator 106 is off the top surface of the substrate 108. Typically, the distance maintained between the force applicator 106 and substrate surface during a cleaning operation is between about 0.1 mm and 100 mm. In another embodiment, the position of the force applicator 106 is fixed and cannot be adjusted. In yet another embodiment, the substrate carrier 604 is configured to allow the adjustment of the distance between the carrier 604/substrate 108 and the force applicator 106.

Continuing with FIG. 6B, the gate 104 is positioned at the trailing point adjacent to the force applicator 106. As depicted in this embodiment, the gate 104 is affixed to both sides of the system containment unit. The gate 104 is configured to planarize the cleaning solution 110 on the substrate surface as the carrier 604 moves the substrate 108 translationally from the first cleaning zone to the second cleaning zone. In one embodiment, the gate 104 is configured to enable adjustment of the vertical distance between the gate 104 and the top surface of the substrate 108. Typically, the distance between the gate 104 and the substrate surface is maintained at a range of between about 0.1 mm and 5.0 mm. In another embodiment, the position of the gate 104 is fixed and cannot be adjusted.

Figure 6C:
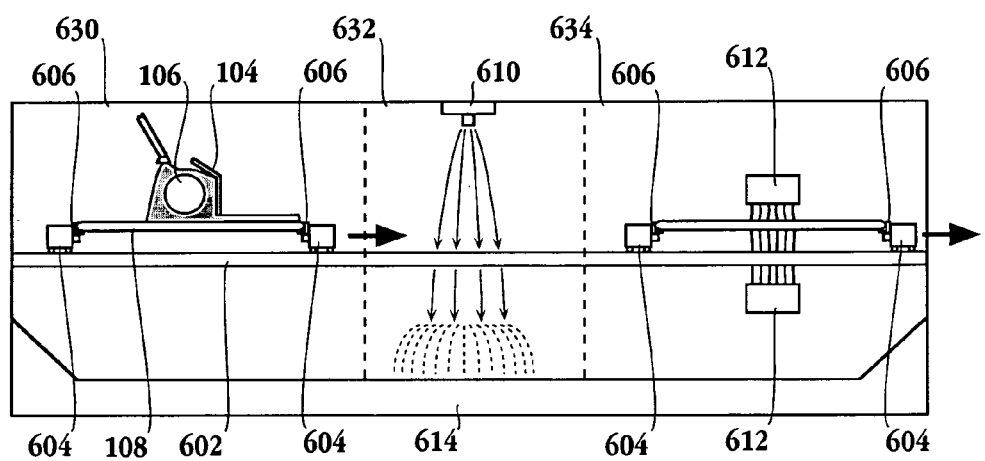
FIG. 6C is an illustration of a side view of a system for cleaning a substrate having surface contaminants, in accordance with one embodiment of the present invention.

FIG. 6C is an illustration of a side view of a system for cleaning a substrate having surface contaminants, in accordance with one embodiment of the present invention. As depicted herein, the substrate 108 is supported by clips 606 attached to a substrate carrier 604. The substrate carrier 604 includes a plurality of wheels that are configured to transport the carrier 604 on guide tracks 602 translationally from one cleaning zone to the next. In one embodiment the carrier 604 is configured to supply the power to the rotate the wheels. In a different embodiment, the carrier 604 is attached to a chain drive that pulls the carrier 604 along on the guide track.

Continuing with FIG. 6C, as discussed above, the first cleaning zone 630 includes a cleaning solution dispenser 102, force applicator 106, and a gate 104. The dispenser supplies the cleaning solution 110 directly to the substrate surface on the leading edge of the force applicator 106. As the carrier 604 transports the substrate 108 along the guide track, the force applicator 106 applies a force against the cleaning solution 110 and the gate 104 at the trailing point of the force applicator 106 simultaneously planarizes the cleaning solution 110 to a desired height off the substrate surface.

As the substrate 108 is transported to the second cleaning zone 632, a plurality of spray dispensers spread across over the entire diameter of the substrate 108 supplies fluids to the rinse off the cleaning solution 110 from the substrate surface. The rinsate is collected in a catch basin at the base of the system containment unit 614. Typically, deionized water (DIW) is used as the rinsing liquid for this application. Moving from the second cleaning zone 632 into the third cleaning zone 634, proximity head units 612 are positioned above and below the substrate surface to provide the final rinse and drying of the substrate surfaces. In one embodiment, the proximity head units 612 are configured to be long enough to provide coverage of the entire diameter of the substrate 108.

Figure 7:
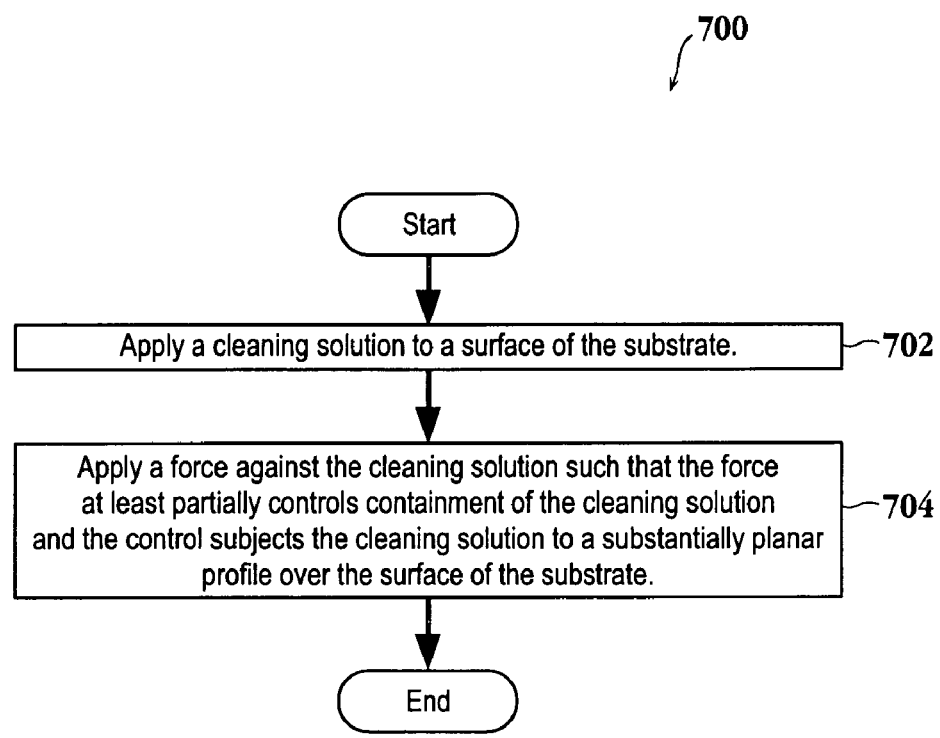
FIG. 7 shows a flow chart of a method for uniformly applying a multi-phase cleaning solution (i.e., foam, emulsions, etc.) across the surface of a substrate, in accordance with one embodiment of the present invention.

FIG. 7 shows a flow chart of a method for uniformly applying a multi-phase cleaning solution (i.e., foam, emulsions, etc.) across the surface of a substrate, in accordance with one embodiment of the present invention. Diagrams of the apparatus and system utilized in this method are shown in FIGS. 1A, 1B, 6A, and 6B. Method 700 begins with operation 702 where a cleaning solution is applied to the surface of a substrate. As discussed previously, the substrate can be either a semiconductor wafer or a LCD flat panel, or other material requiring critical removal of discrete particles. The cleaning solution has a dispersed phase, a continuous phase and solids dispersed throughout the continuous phase. In one embodiment, the cleaning solution is supplied by a cleaning solution dispenser positioned proximate to the leading edge of a force applicator 106. In another embodiment, the cleaning solution is supplied by a manifold dispenser that stretches to match the length of the force applicator.

In one embodiment, the substrate is supported and rotated at between about 4 and 8 rpm using a plurality of powered rollers while the cleaning solution is being applied. In a different embodiment, the substrate is supported and rotated using a vacuum chuck. The vacuum chuck configured to provide a vacuum against the bottom surface of the substrate to prevent the substrate from moving during the rotation and/or cleaning operations.

The method then proceeds to operation 704 where a force is applied against the cleaning solution such that the force partially controls the containment of the solution and subjects the cleaning solution to a substantially planar profile over the surface of the substrate. A force applicator supplies the force and a gate planarizes the cleaning solution over the substrate surface as the applicator and gate moves in unison across the substrate surface. In one embodiment, the position of the force applicator is configured to be fully adjustable to a distance between about 0.1 mm and 100 mm from the surface of the substrate. In another embodiment, the position of the gate is configured to be fully adjustable to a distance between about 0.1 mm and 5.0 mm from the substrate surface. In one embodiment, the applicator and gate are positioned at approximately the same distance form the substrate surface.

Although a few embodiments of the present invention have been described in detail herein, it should be understood, by those of ordinary skill, that the present invention may be embodied in many other specific forms without departing from the spirit or scope of the invention. Therefore, the present examples and embodiments are to be considered as illustrative and not restrictive, and the invention is not to be limited to the details provided therein, but may be modified and practiced within the scope of the appended claims.

What is claimed is:

1. An apparatus used to supply a force onto a solution for cleaning surface contaminants from a substrate, comprising:
    a force applicator configured to be adjusted to a first height off the surface of the substrate such that the force applicator is not in contact with the substrate surface during the cleaning of the surface contaminants from the substrate, wherein the force applicator is comprised of a flexible material enclosed around a plurality of drums, the drums configured to impart rotational motion to the flexible material around the drums; and
    a gate adjacent to the force applicator at a trailing point, where the force applicator is at a leading point, wherein the gate is configured to be adjusted to a second height off the surface of the substrate such that the gate is not in contact with the substrate surface during cleaning so as to enable planarization of the cleaning solution, as the cleaning solution moves towards the trailing point.

2. The apparatus of claim 1, wherein the force applicator is configured to be rotated along an axis of rotation that is parallel to the surface of the substrate.

3. The apparatus of claim 1, wherein the force applicator and the gate are configured to move across the surface of the substrate.

4. The apparatus of claim 1, wherein the first height is between about 0.1 to about 100 millimeters (mm) from the surface of the substrate.

5. The apparatus of claim 1, wherein the second height is between about 0.1 to about 5 millimeters (mm) from the surface of the substrate.

6. The apparatus of claim 1, wherein the gate is affixed to the force applicator.

7. The apparatus of claim 1, wherein the force applicator is made from a solid material selected from the group consisting of polyvinyl alcohol, Teflon™, polyurethane, polytetrafluoroethylene, polyethylene terephthalate, polyvinylidine difluoride, polyetheretherketone, polyvinyl chloride, rubber, aluminum, stainless steel, and tool steel.

8. The apparatus of claim 1, wherein the first height is equal to the second height.

9. The apparatus of claim 1, wherein the cleaning solution includes,
    a liquid component;
    a solid component being defined by a plurality of solids that are dispersed within the liquid component; and
    a gas component intermixed with the liquid component and the solid component, wherein,
    the liquid component, the solid component, and the gas component define a state of the cleaning solution applied to the substrate.

10. An apparatus used to supply a force onto a solution applied on a substrate for cleaning surface contaminants from a substrate, comprising:
    a force applicator configured to be adjusted to a first height off the surface of the substrate, the force applicator equipped with a motorized arm, the motorized arm configured to allow adjustment of the distance between the force applicator and the substrate surface defining a non-contact force applicator for applying the force to the solution applied on the substrate during cleaning of the surface contaminants from the substrate; and
    a gate adjacent to the force applicator at a trailing point, where the force applicator is at a leading point, wherein the gate is configured to be adjusted to a second height off the surface of the substrate such that the gate is not in contact with the substrate surface during cleaning so as to enable planarization of the cleaning solution, as the cleaning solution moves towards the trailing point,
    wherein the gate is integrated with the force applicator so that the gate and the force applicator can move in unison.

11. An apparatus used to supply a force onto a solution for cleaning surface contaminants from a substrate, comprising:
    a force applicator configured to be adjusted to a first height off the surface of the substrate such that the force applicator is not in contact with the substrate surface during the cleaning of the surface contaminants from the substrate, wherein the force applicator has a plurality of baffles affixed along a longitudinal surface of the force applicator, the baffles configured to apply a force against the cleaning solution; and
    a gate adjacent to the force applicator at a trailing point, where the force applicator is at a leading point, wherein the gate is configured to be adjusted to a second height off the surface of the substrate such that the gate is not in contact with the substrate surface during cleaning so as to enable planarization of the cleaning solution, as the cleaning solution moves towards the trailing point.

12. The apparatus of claim 11, wherein the first height is between about 0.1 to about 100 millimeters (mm) from the surface of the substrate.

13. The apparatus of claim 11, wherein the second height is between about 0.1 to about 5 millimeters (mm) from the surface of the substrate.

14. The apparatus of claim 11, wherein the first height is equal to the second height.

* * * * *